United States Patent
Philippou et al.

(10) Patent No.: US 10,910,487 B2
(45) Date of Patent: Feb. 2, 2021

(54) POWER SEMICONDUCTOR DEVICE HAVING TRENCH ELECTRODES BIASED AT THREE DIFFERENT ELECTRICAL POTENTIALS, AND METHOD OF MANUFACTURING THE SAME

(71) Applicant: Infineon Technologies AG, Neubiberg (DE)

(72) Inventors: Alexander Philippou, Munich (DE); Christian Jaeger, Munich (DE); Johannes Georg Laven, Taufkirchen (DE); Max Christian Seifert, Munich (DE); Antonio Vellei, Villach (AT)

(73) Assignee: Infineon Technologies AG, Neubiberg (DE)

( * ) Notice: Subject to any disclaimer, the term of this patent is extended or adjusted under 35 U.S.C. 154(b) by 26 days.

(21) Appl. No.: 16/456,191

(22) Filed: Jun. 28, 2019

(65) Prior Publication Data

US 2019/0319122 A1   Oct. 17, 2019

Related U.S. Application Data

(63) Continuation of application No. 15/704,269, filed on Sep. 14, 2017, now Pat. No. 10,347,754.

(30) Foreign Application Priority Data

Sep. 14, 2016   (DE) .......................... 10 2016 117 264

(51) Int. Cl.
*H01L 29/739*      (2006.01)
*H01L 29/40*       (2006.01)
(Continued)

(52) U.S. Cl.
CPC ...... *H01L 29/7397* (2013.01); *H01L 29/0692* (2013.01); *H01L 29/0696* (2013.01);
(Continued)

(58) Field of Classification Search
CPC ........... H01L 29/7397; H01L 29/66348; H01L 29/407; H01L 29/66734; H01L 29/7813
See application file for complete search history.

(56) References Cited

U.S. PATENT DOCUMENTS

| 5,608,238 A | 3/1997 | Matsuda |
| 9,105,679 B2 | 8/2015 | Laven et al. |

(Continued)

FOREIGN PATENT DOCUMENTS

| DE | 10 2014 109 475 | 1/2015 |
| DE | 10 2014 117 364 | 5/2015 |

(Continued)

*Primary Examiner* — Younes Boulghassoul
(74) *Attorney, Agent, or Firm* — Dicke, Billig & Czaja, PLLC

(57) ABSTRACT

A power semiconductor device is disclosed. In one example, the device comprises a semiconductor body coupled to a first load terminal and a second load terminal and comprising a drift region configured to conduct a load current between said terminals. The drift region comprises dopants of a first conductivity type. A source region is arranged in electrical contact with the first load terminal and comprises dopants of the first conductivity type. A channel region comprises dopants of a second conductivity. At least one power unit cell that includes at least one first type trench. The at least one power unit cell further includes a first mesa zone and a second mesa zone of the semiconductor body.

20 Claims, 7 Drawing Sheets

(51) Int. Cl.
*H01L 29/06* (2006.01)
*H01L 29/41* (2006.01)
*H01L 29/66* (2006.01)
*H01L 29/866* (2006.01)

(52) U.S. Cl.
CPC ............ *H01L 29/407* (2013.01); *H01L 29/41* (2013.01); *H01L 29/66348* (2013.01); *H01L 29/7396* (2013.01); *H01L 29/866* (2013.01); *H01L 29/0619* (2013.01)

(56) References Cited

U.S. PATENT DOCUMENTS

| | | |
|---|---|---|
| 9,337,827 B2 | 5/2016 | Werber |
| 2002/0177277 A1 | 11/2002 | Baliga |
| 2009/0189181 A1 | 7/2009 | Koyama et al. |
| 2010/0118455 A1 | 5/2010 | Kusunoki |
| 2015/0014743 A1 | 1/2015 | Werber et al. |
| 2015/0015309 A1 | 1/2015 | Werber |
| 2015/0144988 A1* | 5/2015 | Laven .................... H01L 29/407 257/139 |
| 2015/0236143 A1 | 8/2015 | Pfirsch et al. |
| 2015/0325687 A1 | 11/2015 | Baburske et al. |
| 2015/0325688 A1 | 11/2015 | Baburske et al. |
| 2015/0349103 A1 | 12/2015 | Onozawa et al. |
| 2016/0099188 A1 | 4/2016 | Jaeger et al. |
| 2016/0155831 A1 | 6/2016 | Madathil |
| 2016/0190123 A1* | 6/2016 | Laven ................. H01L 29/0834 257/140 |
| 2016/0336404 A1 | 11/2016 | Naito |
| 2016/0352326 A1* | 12/2016 | Laven ................. H01L 27/0727 |
| 2016/0372585 A1 | 12/2016 | Furukawa et al. |
| 2017/0077004 A1 | 3/2017 | Onozawa |
| 2017/0236926 A1 | 8/2017 | Imagawa |
| 2018/0158815 A1 | 6/2018 | Onozawa et al. |
| 2018/0323294 A1* | 11/2018 | Okuda ................. H01L 29/4238 |

FOREIGN PATENT DOCUMENTS

| | | |
|---|---|---|
| DE | 10 2014 220 056 | 4/2016 |
| DE | 10 2014 119 543 | 6/2016 |

* cited by examiner

POWER SEMICONDUCTOR DEVICE HAVING TRENCH ELECTRODES BIASED AT THREE DIFFERENT ELECTRICAL POTENTIALS, AND METHOD OF MANUFACTURING THE SAME

CROSS-REFERENCE TO RELATED APPLICATION

This Utility Patent Application is a continuation application of U.S. patent application Ser. No. 15/704,269, filed Sep. 14, 2017, which claims priority to German Patent Application No. 10 2016 117 264.2, filed Sep. 14, 2016, both of which are incorporated herein by reference.

TECHNICAL FIELD

This specification refers to embodiments of a power semiconductor device and to embodiments of a method of processing a power semiconductor device. In particular, this specification is directed to embodiments of a power semiconductor device having one or more power unit cells that each comprise at least three trenches with respective trench electrodes, e.g., for dV/dt controllability, and to corresponding processing methods.

BACKGROUND

Many functions of modern devices in automotive, consumer and industrial applications, such as converting electrical energy and driving an electric motor or an electric machine, rely on power semiconductor devices. For example, Insulated Gate Bipolar Transistors (IGBTs), Metal Oxide Semiconductor Field Effect Transistors (MOSFETs) and diodes, to name a few, have been used for various applications including, but not limited to switches in power supplies and power converters.

A power semiconductor device usually comprises a semiconductor body configured to conduct a load current along a load current path between two load terminals of the device. Further, the load current path may be controlled by means of an insulated electrode, sometimes referred to as gate electrode. For example, upon receiving a corresponding control signal from, e.g., a driver unit, the control electrode may set the power semiconductor device in one of a conducting state and a blocking state.

In some cases, the gate electrode may be included within a trench of the power semiconductor device, wherein the trench may exhibit, e.g., a stripe configuration or a needle configuration.

Further, such trench occasionally includes more than only one electrode, e.g., two or more electrodes that are arranged separately from each other and sometimes also electrically insulated from each other. For example, a trench may comprise both a gate electrode and a field electrode, wherein the gate electrode can be electrically insulated from each of the load terminals, and wherein the field electrode can be electrically connected to one of the load terminals.

It is usually desirable to keep losses, e.g., switching losses, of the power semiconductor device low. For example, low switching losses may be achieved by ensuring short switching durations, e.g., a short turn-on duration and/or a short turn-off duration. On the other hand, in a given application, there may also be requirements regarding a maximum slope of the voltage (dV/dt) and/or a maximum slope of the load current (dI/dt).

SUMMARY

According to an embodiment, a power semiconductor device comprises: a semiconductor body coupled to a first load terminal and a second load terminal of the power semiconductor device and comprising a drift region configured to conduct a load current between said terminals, the drift region comprising dopants of a first conductivity type; a source region arranged in electrical contact with the first load terminal and comprising dopants of the first conductivity type; a channel region comprising dopants of a second conductivity type and isolating the source region from the drift region; at least one power unit cell that includes at least one first type trench, at least one second type trench and at least one third type trench, said trenches being arranged laterally adjacent to each other, wherein each of said trenches extends into the semiconductor body along an extension direction and includes an insulator that insulates a respective trench electrode from the semiconductor body, and wherein the at least one power unit cell further includes a first mesa zone of the semiconductor body, the first mesa zone being laterally confined at least by the at least one first type trench and by the at least one second type trench, the first mesa zone comprising at least a respective section of each of the source region, the channel region and the drift region. The at least one power unit cell also includes a second mesa zone of the semiconductor body, the second mesa zone being laterally confined at least by the at least one third type trench, and wherein, in a vertical cross-section of the power unit cell, the power unit cell is configured to prevent the load current from crossing a transition between the second mesa zone and the first load terminal. The trench electrode of the at least one first type trench is electrically coupled to a control terminal of the power semiconductor device and configured to control the load current in the section of the channel region that is included in the first mesa zone. The trench electrode of the at least one second type trench is electrically connected to the first load terminal. The trench electrode of the at least one third type trench is configured to exhibit another electrical potential than each of the trench electrodes of the at least one first type trench and the at least one second type trench.

According to a further embodiment, a power semiconductor device comprises: a semiconductor body coupled to a first load terminal and a second load terminal of the power semiconductor device and comprising a drift region configured to conduct a load current between said terminals, the drift region comprising dopants of a first conductivity type; a source region arranged in electrical contact with the first load terminal and comprising dopants of the first conductivity type; a channel region comprising dopants of a second conductivity type and isolating the source region from the drift region; at least one power unit cell that includes at least one first type trench, at least one second type trench and at least one third type trench, said trenches being arranged laterally adjacent to each other, wherein each of said trenches extends into the semiconductor body along an extension direction and includes an insulator that insulates a respective trench electrode from the semiconductor body. The at least one power unit cell further includes: a first mesa zone of the semiconductor body, the first mesa zone being laterally confined at least by the at least one first type trench and comprising at least a respective section of each of the source region, the channel region and the drift region, wherein the trench electrode of the at least one first type trench is electrically coupled to a control terminal of the power semiconductor device and configured to control the load current in the section of the channel region that is included in the first mesa zone; and a second mesa zone of the semiconductor body, the second mesa zone being laterally confined at least by the at least one third type trench, and wherein, in a vertical cross-section of the power unit cell, the power unit cell is configured to prevent the load current from crossing a transition between the second mesa zone and the first load terminal, and wherein the trench electrode of the at least one third type trench is configured to exhibit another electrical potential than each of the trench electrode of the at least one first type trench and the first load terminal. The second mesa zone is further laterally confined by at least one further first type trench.

According to another embodiment, a method of processing a power semiconductor device comprises: forming a semiconductor body to be coupled to a first load terminal and a second load terminal of the power semiconductor device and that includes a drift region configured to conduct a load current between said terminals, the drift region comprising dopants of a first conductivity type; forming a source region to be arranged in electrical contact with the first load terminal and comprising dopants of the first conductivity type; forming a channel region comprising dopants of a second conductivity type and isolating the source region from the drift region; creating at least one power unit cell that includes at least one first type trench, at least one second type trench and at least one third type trench, said trenches being arranged laterally adjacent to each other, wherein each of said trenches extends into the semiconductor body along an extension direction and includes an insulator that insulates a respective trench electrode from the semiconductor body. The method further comprises configuring the at least one power unit cell such that it includes a first mesa zone of the semiconductor body, the first mesa zone being laterally confined at least by the at least one first type trench and comprising at least a respective section of each of the source region, the channel region and the drift region, wherein the trench electrode of the at least one first type trench is to be electrically coupled to a control terminal of the power semiconductor device and configured to control the load current in the section of the channel region that is included in the first mesa zone; and a second mesa zone of the semiconductor body, the second mesa zone being laterally confined at least by the at least one third type trench, and wherein, in a vertical cross-section of the power unit cell, the power unit cell is configured to prevent the load current from crossing a transition between the second mesa zone and the first load terminal, and wherein the trench electrode of the at least one third type trench exhibits another electrical potential than each of the trench electrode of the at least one first type trench and the first load terminal. The second mesa zone is further laterally confined by at least one further first type trench.

Those skilled in the art will recognize additional features and advantages upon reading the following detailed description, and upon viewing the accompanying drawings.

BRIEF DESCRIPTION OF THE DRAWINGS

The parts in the figures are not necessarily to scale, instead emphasis being placed upon illustrating principles of the invention. Moreover, in the figures, like reference numerals designate corresponding parts. In the drawings.

DETAILED DESCRIPTION

Figure 1:
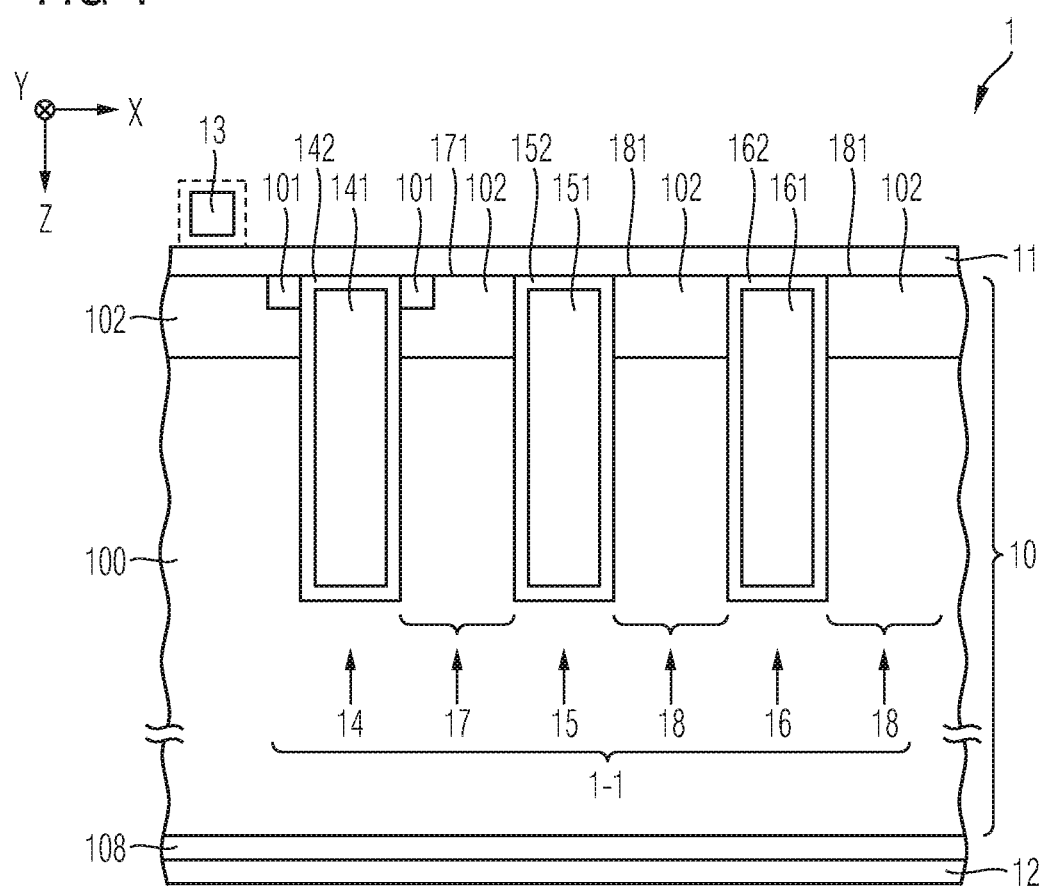
FIG. 1 schematically and exemplarily illustrates a section of a vertical cross-section of a power semiconductor device in accordance with one or more embodiments.

In the following detailed description, reference is made to the accompanying drawings which form a part hereof and in which are shown by way of illustration specific embodiments in which the invention may be practiced.

In this regard, directional terminology, such as "top", "bottom", "below", "front", "behind", "back", "leading", "trailing", "above" etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appended claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a horizontal surface of a semiconductor substrate or of a semiconductor structure. This can be for instance the surface of a semiconductor wafer or a die. For example, both the first lateral direction X and the second lateral direction Y mentioned below can be horizontal directions, wherein the first lateral direction X and the second lateral direction Y may be perpendicular to each other.

The term "vertical" as used in this specification intends to describe an orientation which is substantially arranged perpendicular to the horizontal surface, i.e., parallel to the normal direction of the surface of the semiconductor wafer. For example, the extension direction Z mentioned below may be an extension direction that is perpendicular to both the first lateral direction X and the second lateral direction Y.

In this specification, n-doped is referred to as "first conductivity type" while p-doped is referred to as "second conductivity type". Alternatively, opposite doping relations can be employed so that the first conductivity type can be p-doped and the second conductivity type can be n-doped.

Further, within this specification, the term "dopant concentration" may refer to an average dopant concentration or, respectively, to a mean dopant concentration or to a sheet charge carrier concentration of a specific semiconductor region or semiconductor zone. Thus, e.g., a statement saying that a specific semiconductor region exhibits a certain dopant concentration that is higher or lower as compared to a dopant concentration of another semiconductor region may indicate that the respective mean dopant concentrations of the semiconductor regions differ from each other.

In the context of the present specification, the terms "in ohmic contact", "in electric contact", "in ohmic connection", and "electrically connected" intend to describe that there is a low ohmic electric connection or low ohmic current path between two regions, sections, zones, portions or parts of a semiconductor device or between different terminals of one or more devices or between a terminal or a metallization or an electrode and a portion or part of a semiconductor device. Further, in the context of the present specification, the term "in contact" intends to describe that there is a direct physical connection between two elements of the respective semiconductor device; e.g., a transition between two elements being in contact with each other may not include a further intermediate element or the like.

In addition, in the context of the present specification, the term "electric insulation" is used, if not stated otherwise, in the context of its general valid understanding and thus intends to describe that two or more components are positioned separately from each other and that there is no ohmic connection connecting those components. However, components being electrically insulated from each other may nevertheless be coupled to each other, for example mechanically coupled and/or capacitively coupled and/or inductively coupled. To give an example, two electrodes of a capacitor may be electrically insulated from each other and, at the same time, mechanically and capacitively coupled to each other, e.g., by means of an insulation, e.g., a dielectric.

Specific embodiments described in this specification pertain to, without being limited thereto, a power semiconductor device exhibiting a stripe cell or needle cell configuration, such as a power semiconductor transistor, that may be used within a power converter or a power supply. Thus, in an embodiment, the semiconductor device is configured to carry a load current that is to be fed to a load and/or, respectively, that is provided by a power source. For example, the semiconductor device may comprise one or more active power unit cells, such as a monolithically integrated diode cell, and/or a monolithically integrated transistor cell, and/or a monolithically integrated IGBT cell, and/or a monolithically integrated RC-IGBT cell, and/or a monolithically integrated MOS Gated Diode (MGD) cell, and/or a monolithically integrated MOSFET cell and/or derivatives thereof. Such diode cell and/or such transistor cells may be integrated in a power semiconductor module. A plurality of such cells may constitute a cell field that is arranged with an active region of the power semiconductor device.

The term "power semiconductor device" as used in this specification intends to describe a semiconductor device on a single chip with high voltage blocking and/or high current-carrying capabilities. In other words, such power semiconductor device is intended for high current, typically in the Ampere range, e.g., up to several ten or hundred Ampere or even up to some kA, and/or high voltages, typically above 15 V, more typically 100 V and above, e.g., up to at least 400 V, up to at least one or more kV. For example, the processed semiconductor device described below may be a semiconductor device exhibiting a stripe cell configuration or a needle cell configuration and can be configured to be employed as a power component in a low-, medium- and/or high voltage application.

For example, the term "power semiconductor device" as used in this specification is not directed to logic semiconductor devices that are used for, e.g., storing data, computing data and/or other types of semiconductor based data processing.

FIG. 1 schematically and exemplarily section of a vertical cross-section of a power semiconductor device 1 in accordance with one or more embodiments. The illustrated cross-section is in parallel with the plane defined by the first lateral direction X and the extension direction Z. Each of the illustrated components of the power semiconductor device 1 may extend into the second lateral direction Y.

The power semiconductor device 1 comprises a semiconductor body 10 coupled to a first load terminal 11 and a second load terminal 12 of the power semiconductor device 1. For example, the power semiconductor device exhibits an IGBT structure, e.g., an RC-IGBT structure. Accordingly, the first load terminal 11 may be a source terminal and may comprise a first metallization, for example a frontside metallization. Further, the second load terminal 12 may be collector terminal and may comprise a second metallization, for example backside metallization.

The semiconductor body 10 may comprise a drift region 100 that is configured to conduct a load current between said terminals 11 and 12. The drift region 100 can comprise dopants of a first conductivity type. For example, the drift region 100 is an n$^-$-doped region.

Further, there may be included a source region 101 arranged in electrical contact with the first load terminal 11 and comprising dopants of the first conductivity type. For example, the source region 101 is an n$^+$-doped region.

They are may also be included a channel region 102 comprising dopants of the second conductivity type and isolating the source region 101 from the drift region 100. For example, the channel region 102 is a p-doped region. The channel region 102 may also be arranged in electrical contact with the first load terminal 11. To this end, the channel region 102 may comprise one or more subregions (not illustrated) that may exhibit a locally increased dopant concentration, e.g., one or more p$^+$-doped subregions, so as to provide for a low ohmic contact to the first load terminal 11.

In proximity to the second load terminal 12, there may be arranged a semiconductor contact region 108, e.g., a collector region, e.g., a p$^+$-doped region. For example, the region 108 is arranged in electrical contact with the second load terminal 12 on the one side and is electrically coupled to the drift region 100 on the other side facing to the first load terminal 11. Further, they may be provided a field stop region (not illustrated) in the semiconductor body 10, e.g., in between the semiconductor contact region 108 and the drift region 100, e.g., n$^+$-doped field stop region. In addition, the semiconductor contact region 108 may comprise one or more n$^+$-doped regions (also referred to as "n-shorts"), e.g., so as to provide for RC-IGBT functionality.

The power semiconductor device 1 may further comprise at least one power unit cell 1-1. It shall be understood that the power semiconductor device 1 may comprise a plurality of such power unit cells 1-1, e.g., more than 10, more than 100 or even more than 1000 of such power unit cells, wherein each of such power unit cells 1-1 may be arranged in an active region of the power semiconductor device 1, and wherein each of the power unit cells 1-1 can be configured to conduct at least a respective part of the load current. The active region of the power semiconductor device 1 may be at least partially surrounded by an edge region (cf. reference numeral 1-2 in FIGS. 6A-E) that may be come into being, e.g., by means of wafer dicing. For example, the edge region is not configured to conduct the load current. Further, the power unit cells 1-1 may all exhibit the same configuration or, in another embodiment, may differ in configuration, as will be explained in more detail below.

FIGS. 1 to 3 and FIGS. 6A-D each schematically and exemplarily illustrate a respective configuration of one or more selected power unit cells 1-1 of the power semiconductor device 1. Already at this point, it shall be emphasized that the power unit cells 1-1 of an exemplary embodiment of the power semiconductor device 1 must not necessarily each exhibit the same configuration, e.g., in terms of a neighborhood relationship between the at least one first trench type 14, the at least one second trench type 15 and the at least one third trench type 16 as well as between first mesa zone 17 and the second mesa zone 18 mentioned below. In some embodiments, equally configured power unit cells 1-1 may be employed, and in other embodiments, said neighborhood relationship of the different trenches 14, 15 and 16 may change between adjacent power unit cells 1-1.

For example, the power unit cell 1-1 includes at least one first type trench 14, at least one second type trench 15 and at least one third type trench 16. The trenches 14, 15 and 16 can be arranged laterally adjacent to each other, wherein each of said trenches 14, 15 and 16 extends into the semiconductor body 10 along the extension direction Z and includes an insulator 142, 152, 162 that insulates a respective trench electrode 141, 151, 161 from the semiconductor body 10. For example, the trenches 14, 15 and 16 all extend from the first load terminal 11 towards the second load terminal 12. All trenches 14, 15 and 16 may extend into the drift region 100. For example, the drift region 100 exhibits a total extension along the extension direction Z, and each of the trenches 14, 15 and 16 extend for at least 1 μm into the drift region 100. Adjacent trenches may be separated from each other by one of a first mesa zone 17 and a second mesa zone 18.

Further, all trenches 14, 15 and 16 may exhibit a stripe configuration, meaning that their total extensions along the second lateral direction Y exceed their respective total extensions along the first lateral direction X, i.e., their respective widths, by at least a multiple. For example, the trenches 14, 15 and 16 of the power semiconductor device 1 are arranged in accordance with a micro pattern trench (MPT) structure.

As illustrated in FIG. 1, the at least one power unit cell 1-1 can include a first mesa zone 17 of the semiconductor body 10, wherein the first mesa zone 17 can be laterally confined at least by the at least one first type trench 14. On the other side, the first mesa zone 17 may be laterally confined by at least one of a further first type trench 14, e.g., so as to realize a so-called dual gate configuration, a second type trench 15 and a third trench type 16. The first mesa zone 17 may comprise at least a respective section of each of the source region 101, the channel region 102 and the drift region 100.

For example, thereby, the first mesa zone 17 is configured to conduct at least a part of the load current. For example, the power unit cell 1-1 is configured so as to allow the load current in the first mesa zone 17 to cross a first transition 171 formed between the first load terminal 11 and the first mesa zone 17. To this end, a contact plug 111 or, respectively, a contact groove 111 that is schematically and exemplarily illustrated in FIG. 2 may optionally be provided. Further, the section of the source region 101 that is included in the first mesa zone 17 may be arranged in contact with the insulator 142 of the first type trench type 14. In addition, said section of the source region 101 may also—in contrast to the schematic and exemplary illustration in FIG. 1—be arranged in contact with the other trench that laterally confines the first mesa zone 17, which is the second type trench 15 in accordance with the embodiments of FIGS. 1 and 2. This optional aspect is also schematically and exemplarily illustrated in FIG. 2.

As illustrated in FIG. 1, the at least one power unit cell 1-1 can further include a second mesa zone 18 of the semiconductor body 10, the second mesa zone 18 being laterally confined at least by the at least one third type trench 16. For example, in a vertical cross-section of the power unit cell 1-1, the power unit cell 1-1 is configured to prevent the load current from crossing a second transition 181 between the second mesa zone 18 and the first load terminal 11. For example, in the illustrated vertical cross-section, the second mesa zone 18 is not arranged in electrical contact with the first load terminal 11. For example, the second mesa zone 18 does not comprise a section of the source region 101 and/or the connection between the section of the channel region 102 that may be part of the second mesa zone 18 on the one side and the first load terminal 11 on the other side is a high ohmic connection. However, it shall be understood that, proceeding along the second lateral direction Y, there may be established an electrical connection in the second transition 181 between the second mesa zone 18 and the first load terminal 11.

For example, in an embodiment, at least 80% of the load current conducted by the semiconductor body 10 crosses at said first transitions 171 formed between the first mesa zones 17 and the first load terminal 11. This percentage share can be even greater, e.g., 90% or even at least 95%, or even 100%. For example, the remaining percentage share of the load current may cross at said second transitions 181 formed between the second mesa zones 18 and the first load terminal 11, in accordance with an embodiment.

In accordance with an embodiment, the third type trench 16 is arranged in between two second mesa zones 18. In the cross-sections illustrated in FIG. 1 and FIG. 2, the power unit cell 1-1 is configured to prevent the load current from crossing the second transitions 181 between both second mesa zones 18 and the first load terminal 11. For example, the third type trench 16 is nor arranged adjacent or in contact with the first mesa zone 17.

The trench electrode 141 of the at least one first type trench 14 can be electrically coupled to a control terminal 13 of the power semiconductor device and configured to control the load current in the section of the channel region 102 that is included in the first mesa zone 17. The control terminal 13 may be a gate terminal 13. For example, by means of the trench electrode 141 of the at least one first type trench 14, the power semiconductor device 1 can be set into a conducting state during which forward load current may be conducted in the semiconductor body 10, and into the blocking state, during which flow of the forward load current is inhibited and a forward voltage applied between the second load terminal 12 and the first load terminal 11 is blocked.

For example, the trench electrode 141 of the at least one first type trench 14 is configured to induce an inversion channel within the channel region 102. For example, a control signal generator (cf., e.g., reference numeral 3 in FIG. 4) can be provided, e.g., a gate driver unit, that is configured to provide a control signal to the control terminal 13. For example, the control signal is provided as a control voltage between the control terminal 13 and the first load terminal 11 and the electrical potential of the control terminal 13 may be provided to the trench electrode 141 of the at least one first type trench 14. In an embodiment, the power semiconductor device 1 may be controlled, by means of the trench electrode 141 of the at least one first type trench 14 that controls the first mesa zone 17, in accordance with a usual manner of controlling an IGBT and/or an RC-IGBT.

In an embodiment, the trench electrode 151 of the at least one second type trench 15 is electrically connected to the first load terminal 11. In another embodiment, the trench electrode 151 of the at least one second type trench 15 is not necessarily electrically connected to the first load terminal 11, but may exhibit another electrical potential, e.g., the same electrical potential as the trench electrode 141 of the at least one first type trench 14 or the same the same electrical potential as trench electrode 161 of the at least one third type trench 16.

In an embodiment, the trench electrode 161 of the third type trench 16 is configured to exhibit another electrical potential than each of the trench electrodes 141, 151 of the first type trench 14 and the second type trench 15. For example, the trench electrode 161 of the third type trench 16 is configured to exhibit said other electrical potential at least during a switching operation of the power semiconductor device 1 in order to influence the switching operation of the power unit cell 1-1.

For example, the trench electrode 161 of the third type trench 16 exhibits another electrical potential than each of the trench electrodes 141, 151 of the first type trench 14 and the second type trench 15. The trench electrode 161 of the third type trench 16 may exhibit another electrical potential than each of the first load terminal 11 and the control terminal 13. Thus, the operation in the power unit cell 1-1, e.g., a switching operation, e.g., a turn-on process, may be controlled or, respectively, at least influenced by at least three different electrical potentials, namely the electrical potential of the control terminal 13, which may for example be provided by a gate driver, the electrical potential of the first load terminal 11, which may for example be defined by a point external of the power semiconductor device 1, e.g. mass or ground connection, and a third electrical potential, namely the electrical potential of the trench electrode 161 of the third type trench 16. This may allow for an improved switching characteristic of the power semiconductor device, in accordance with one or more embodiments.

For example, the electrical potential of the trench electrode 161 of the third type trench 16 is a self-adjusting electrical potential and, e.g., not a controlled electrical potential that is provided by a control signal generator or the like. Thus, in an embodiment, the electrical potential of the trench electrode 161 of the at least one third type trench 16 is not a second gate signal provided by a gate driver or the like.

Figure 4:
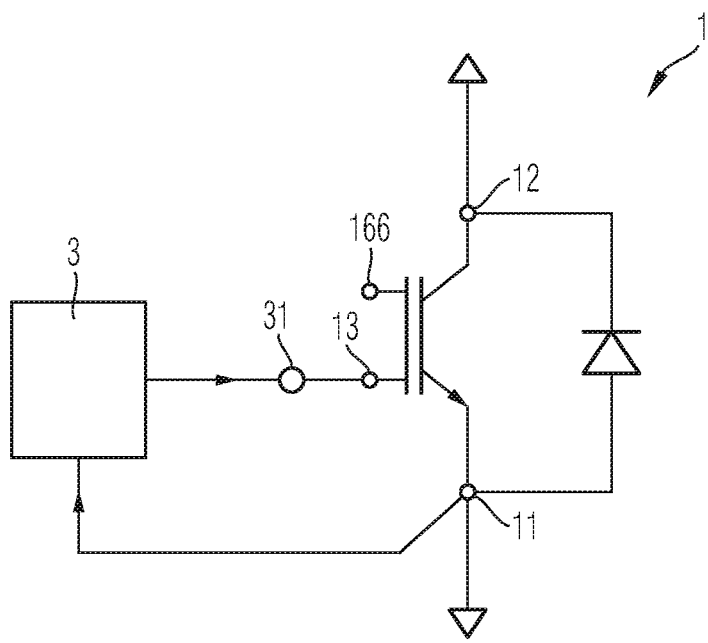
FIG. 4 schematically and exemplarily illustrates a connection scheme for a power semiconductor device in accordance with one or more embodiments.

As has been explained above, the power semiconductor device 1 can be a switchable power semiconductor device and the trench electrode 141 of the first type trench 14 can be configured to control switching operation by receiving a control signal having a defined control voltage, e.g., from a control signal generator (cf., e.g., reference numeral 3 in FIG. 4). In an embodiment, the trench electrode 161 the third type trench 16 is configured to exhibit an electrical potential that differs from the electrical potential of the trench electrode 141 of the first type trench 14 by at least 1 V for at least 10% of the duration of the switching operation, e.g., during a turn-on operation. In an embodiment, said difference in electrical potential is present during a turn-on operation, e.g., at least in the moment where the turn-on load current exhibits a peak, i.e., in the moment where dI/dt of the turn-on load current changes from a positive value to a negative value. For example, the trench electrode 161 of the third type trench 16 is configured to change its relative electrical potential during turn-on of the power semiconductor device 1 compared to one of the first load terminal 11 and the control terminal 13.

For example, the trench electrode 161 of the third type trench 16 can be configured to reduce a voltage-over-time ratio during a switching operation of the power semiconductor device 1, e.g., during a turn-on operation, wherein said change of voltage (dV/dt) occurs between the load terminals 11 and 12. For example, the said reduction of the dV/dt may be achieved due to said difference in electrical potential of at least 1 V mentioned above.

Figure 2:
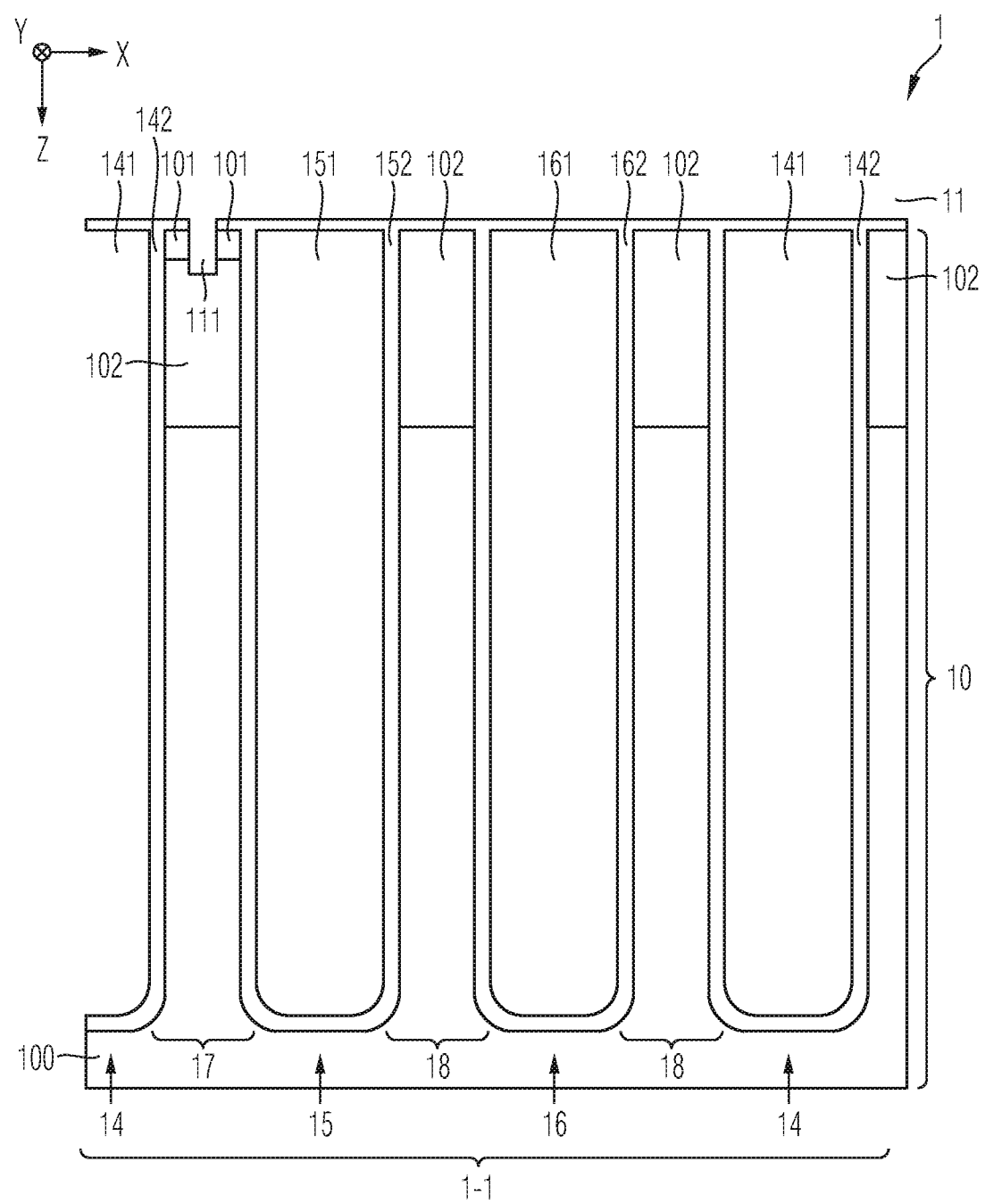
FIG. 2 schematically and exemplarily illustrates a section of a vertical cross-section of a power semiconductor device in accordance with one or more embodiments.

The optional aspect concerning the dV/dt reduction by means of the trench electrode 161 of the third type trench 16 shall be elucidated in more detail with regards to FIG. 2.

As illustrated in FIG. 2, the power unit cell 1-1 may further comprise a further first type trench 14. For example, the mesa zone 17 that is configured to conduct the load current is laterally confined by one first type trench 14 on the one side and by one second type trench 15 on the other side. The trench electrode 141 of the first type trench 14 may be configured to control the load current in the first mesa zone 17, e.g., by inducing an inversion channel in the section of the channel region 102 included in the first mesa zone 17. As has been explained above, the load current may cross the first transition 171 formed between the first mesa zone 17 and the first load terminal 11. The trench electrode 151 of the second type trench 15 that also laterally confines the first mesa zone 17 may be electrically connected to the first load terminal 11, in accordance with an embodiment.

Adjacent to this second type trench 15, there may be arranged the third type trench 16. For example, the second type trench 15 and the third type trench 16 laterally confine the second mesa zone 18. For example, in the illustrated cross-section, the load current conducted by the semiconductor body 10 does not cross the second transition 181. In accordance with an embodiment, the power unit cell 1-1 may further comprise a further first type trench 14 that is arranged laterally adjacent to the third type trench 16, as illustrated in FIG. 2. For example, the third type trench 16 and said additional first type trench 14 laterally confine a further second mesa zone 18. Also in this further second mesa zone 18, the load current does not cross the second transition 181 formed between the first load terminal 11 and the further second mesa zone 18, in accordance with an embodiment. Further, the trench electrode 141 of the additional first type trench 14 may be electrically connected to the same electrical potential, e.g., to said control terminal 13, as the trench electrode 141 of the first type trench 14 shown in the left beginning of the power unit cell 1-1. In the following, this additional first type trench 14 that laterally confines the second mesa zone 18 where the load current does not cross the second transition 181 is also referred to as "dummy trench 14". As each of the first type trench 14 and the dummy trench 14 can be configured in an identical manner, e.g., with both trench electrodes 141 electrically coupled to the control terminal 13, the same reference numeral "14" is employed herein.

In an embodiment, during the switching operation, e.g., during turn-on the power semiconductor device 1, the trench electrode 161 of the third type trench 16 can be configured such that its electrical potential shields the trench electrode 141 of the dummy trench 14 from displacement current, e.g., if the amplitude of the turn-on current increases, e.g., if dI/dt>0. For example, the trench electrode 161 is configured to attract, during a turn-on operation, a current formed by charge carriers of the second conductivity type in the region of the dummy trench 14. Thereby, a reduction of said dV/dt during the switching operation of the power semiconductor device 1 may be achieved, wherein said reduction may be related to a comparison with a configuration of a power unit cell where not at least one third type trench is provided that as a trench electrode that exhibits an electrical potential different than the potential of the first load terminal and different from the potential of the control terminal.

In accordance with an embodiment, the third type trench 16 is arranged in proximity, e.g., adjacent to said dummy trench 14. As has been explained above, the dummy trench 14 may be equally configured as the first type trench 14, the difference being rather constituted by the adjacent mesa zone: whereas the trench electrode 141 of the first type trench 14 may control the load current in the adjacent first mesa zone 17, the dummy trench can be arranged adjacent to the second mesa zone 18 where the load current does not cross the second transition 181 to the first load terminal 11, in accordance with an embodiment.

Figure 3:
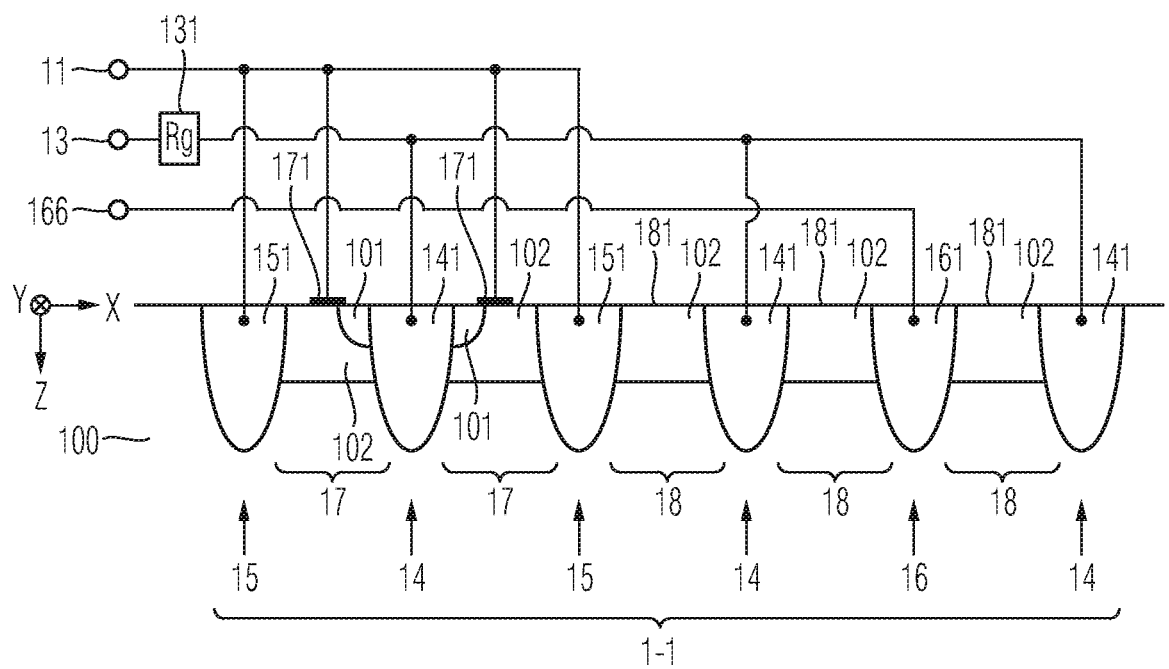
FIG. 3 schematically and exemplarily illustrates a section of a vertical cross-section of a power semiconductor device in accordance with one or more embodiments.

Regarding now FIG. 3, another exemplary configuration of the power unit cell 1-1 shall be explained. For example, the first type trench 14 is neighbored by two first mesa zones 17 that are laterally confined by a pair of second type trenches 15. Adjacent thereto, there may be arranged two dummy trenches 14 and the first type trench 16 in between the two dummy trenches 14. These three further trenches 14 and 16 laterally confine three second mesa zones 18, which can be configured to prevent the load current from crossing the second transitions 181, as has been explained above. For example, the first mesa zones 17 and the trench electrode 151 of the second type trench 15 are electrically connected to the electrical potential of the first load terminal 11. The trench electrodes 141 of the first type trench 14 and the dummy trenches 14 can be electrically coupled to the control terminal 13, wherein such electrical coupling may include a gate resistor 131. For example, the gate resistor 131 exhibits a resistance of some Ohms, e.g., of less than 10 Ω, e.g. of approximately 2 Ω. The trench electrode 161 of the third type trench 16 may exhibit an electrical potential 166 that can be different from each of the electrical potential of the first load terminal 11 and the electrical potential of the control terminal 13.

FIG. 4 schematically and exemplarily illustrates a connection scheme for a power semiconductor device 1 in accordance with one or more embodiments. As has been explained above, the power semiconductor device 1 may exhibit an IGBT configuration, e.g., an RC-IGBT configuration, whose circuit symbol is depicted in FIG. 4. For example, the first load terminal 11 is a source (or, respectively, emitter) terminal that may be electrically connected to ground. The second load terminal 12 may be a collector terminal that may be electrically connected to a high electrical potential. The control terminal 13 may be a gate terminal that can be electrically connected to a control signal generator 3, e.g., a gate driver. The control signal generator 3 may be arranged external of the power semiconductor device 1 or, alternatively, it may be integrated in the power semiconductor device 1. Further, between an output terminal 31 of the control signal generator 3 and the control terminal 13, there may be included a gate resistor (not illustrated). For example, a further terminal may be provided as part of the power semiconductor device 1, the further terminal exhibiting the electrical potential 166 of the trench electrode 161 of the third type trench 16.

In an embodiment, the electrical potential 166 of the trench electrode 161 of the third type trench 16 is a floating electrical potential. To this end, said further terminal is not coupled to a defined electrical potential but, for example, entirely electrically insulated. For example, in this embodiment, there is no electrical path between the trench electrode 161 on the one side and each of the first load terminal 11 and the control terminal 13 on the other side.

In another embodiment, the trench electrode 161 of the third type trench 16 may be coupled to a terminal of the power semiconductor device 1 that exhibits a defined electrical potential. Said terminal of the power semiconductor device 1 may be, for example, one of the first load terminal 11, the second control terminal 12, the control terminal 13 or another terminal that exhibits another electrical potential than each of the first load terminal 11, the second load terminal 12 and the control terminal 13. This aspect shall be elucidated in more detail with respect to the FIGS. 5 A-C, which each schematically and exemplarily illustrate a connection scheme for trench electrodes of the power semiconductor device 1 in accordance with one or more embodiments.

Figure 5A:
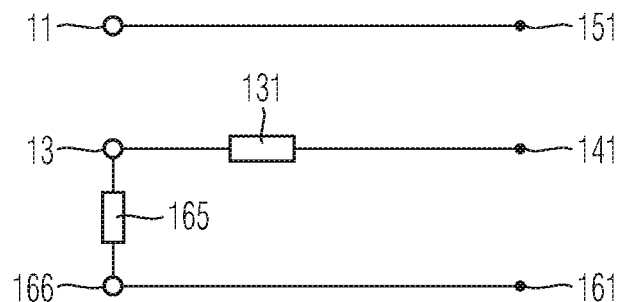
FIG. 5A-C each schematically and exemplarily illustrate a connection scheme for trench electrodes of a power semiconductor device in accordance with one or more embodiments, and FIG. 6A-E each schematically and exemplarily illustrates a section of a horizontal projection of a power semiconductor device in accordance with one or more embodiments.
Figure 5B:
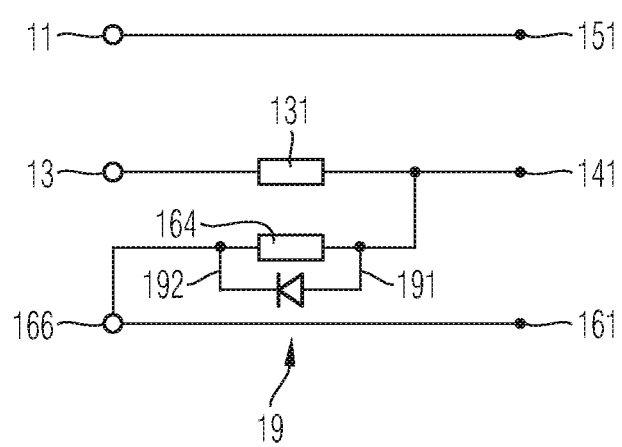
Figure 5C:
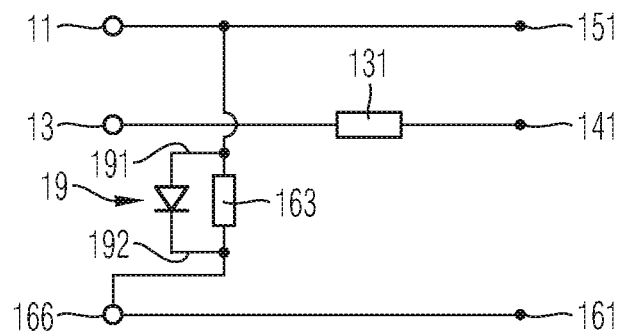
Figure 6A:
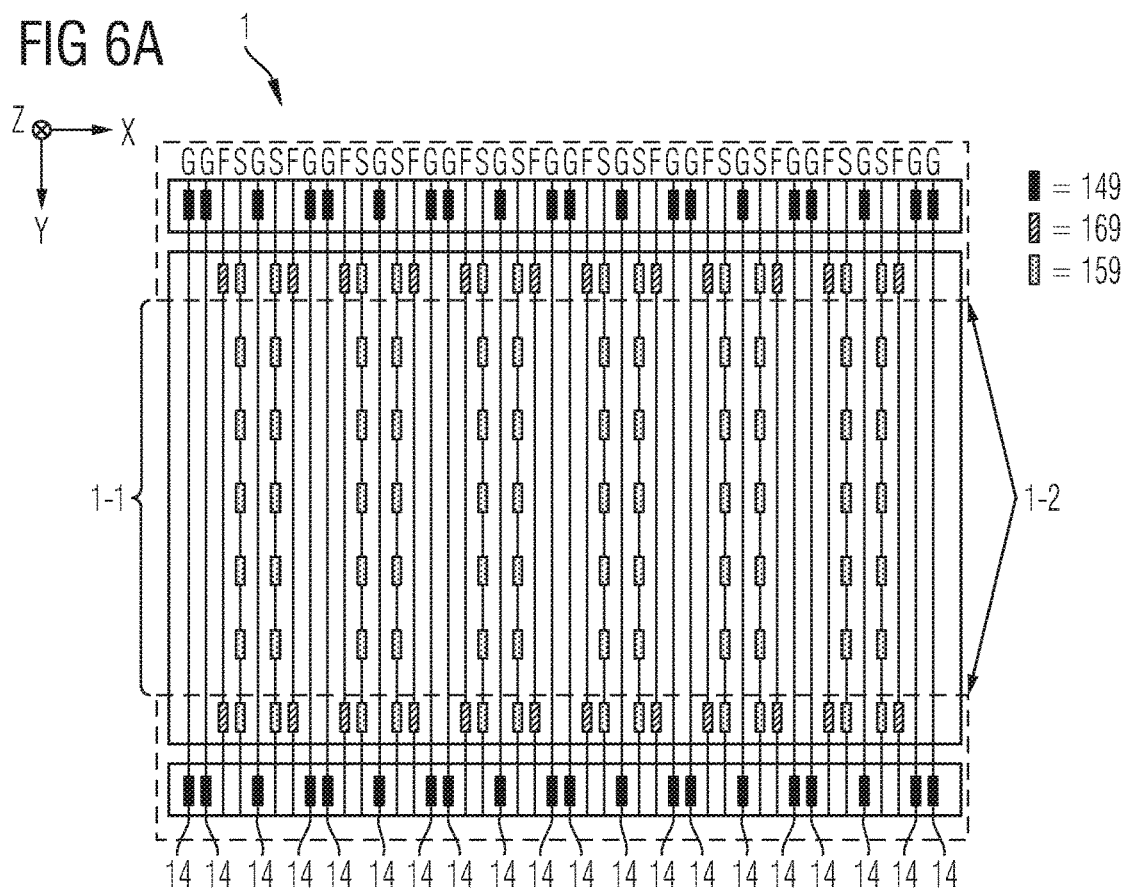
Figure 6B:
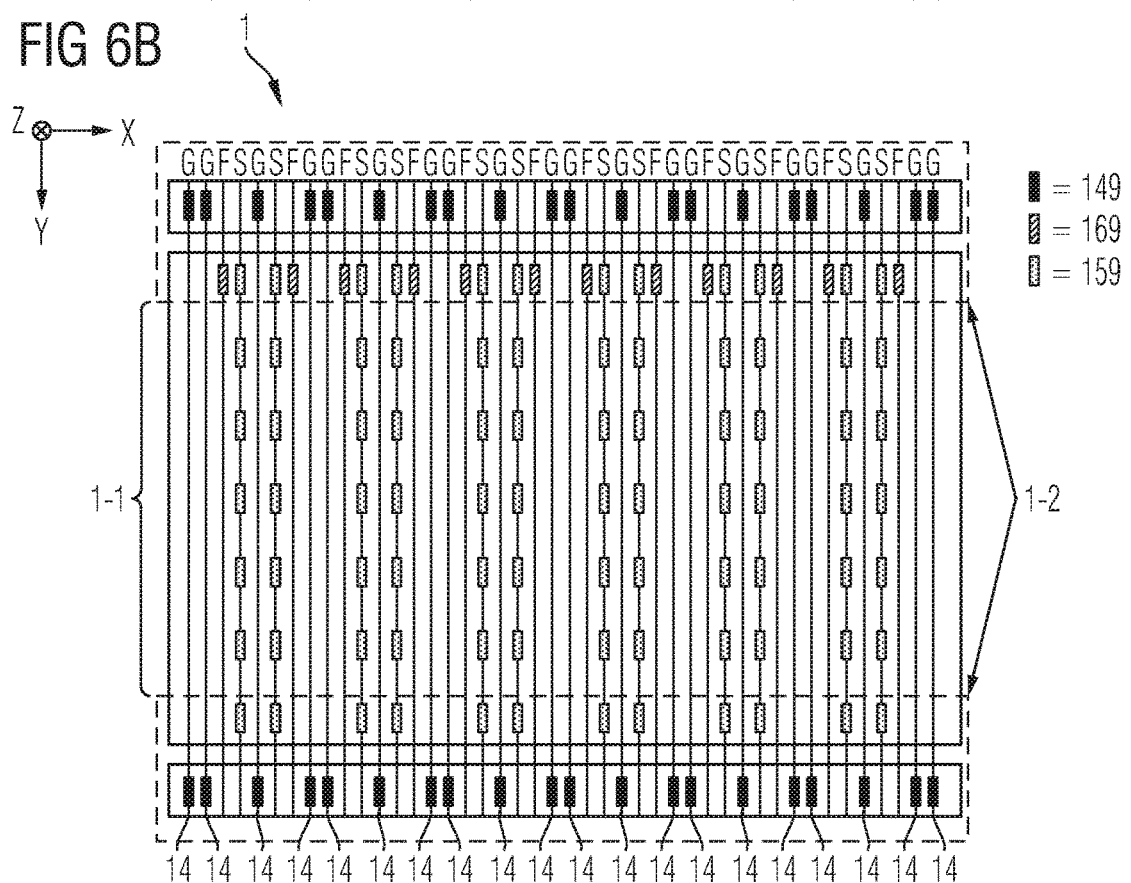
Figure 6C:
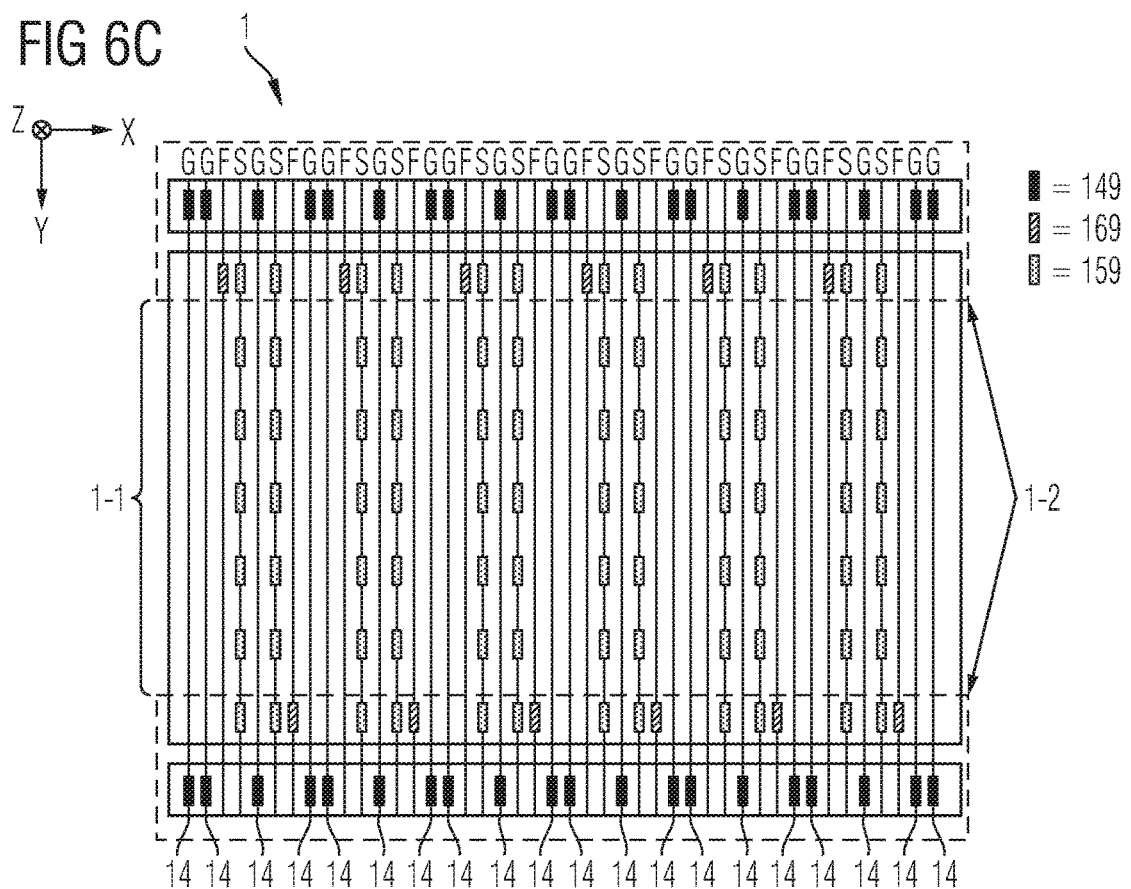
Figure 6D:
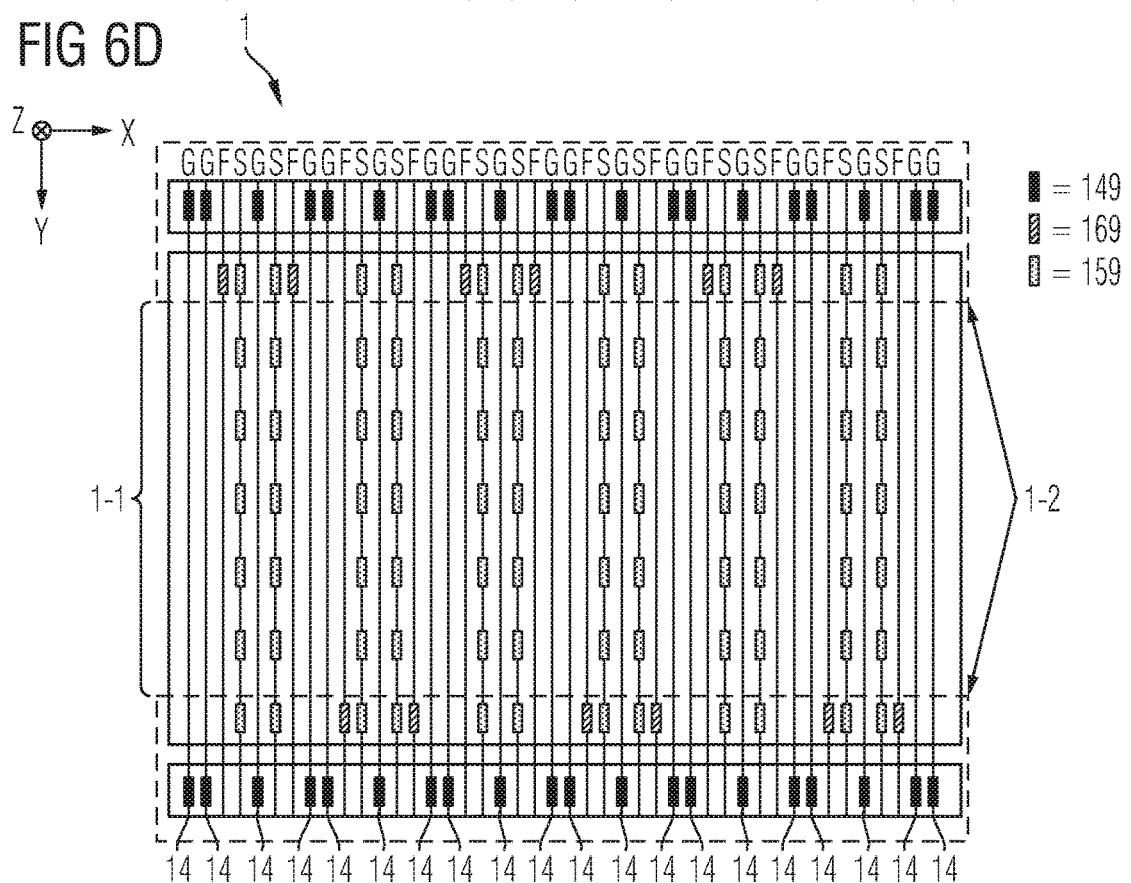
Figure 6E:
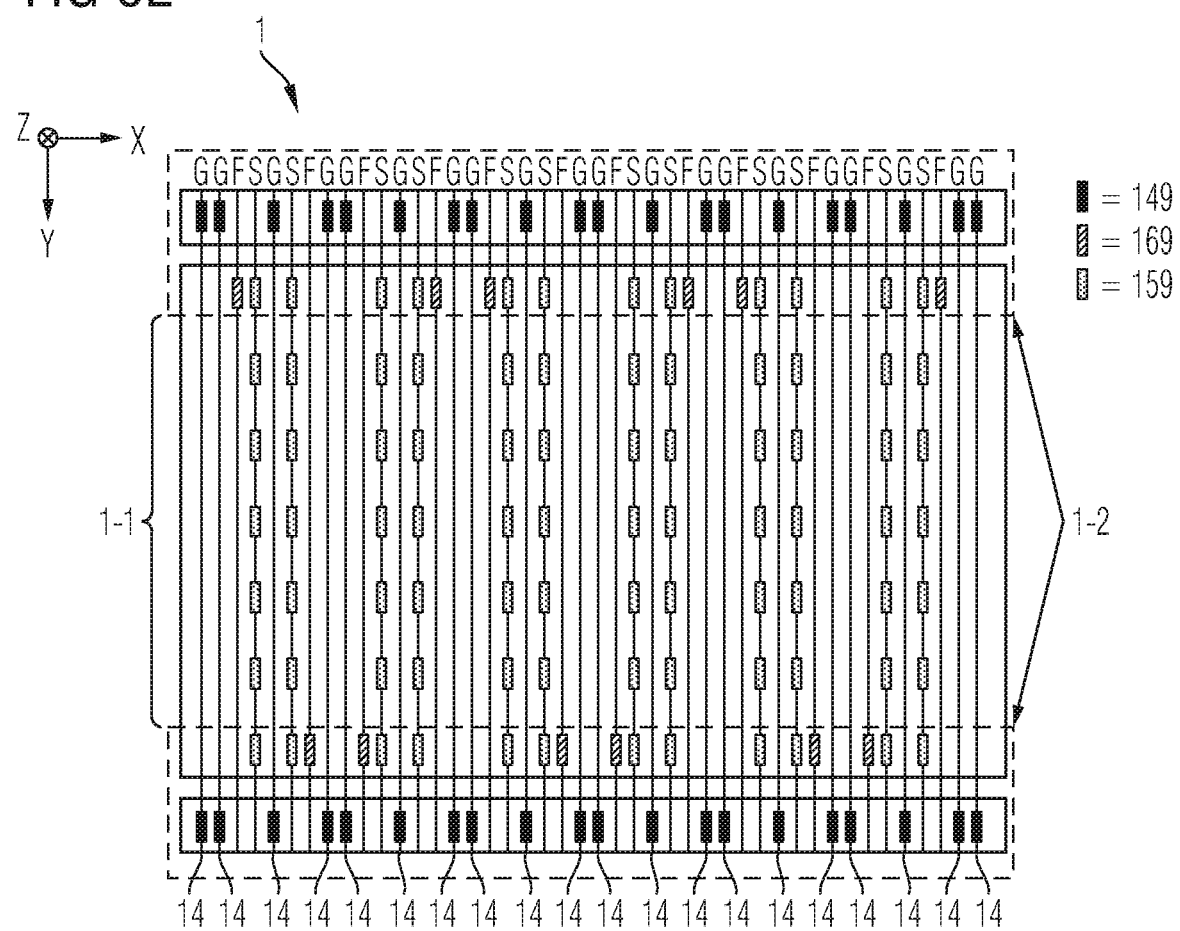

For example, in accordance with the embodiments illustrated in each of FIGS. 5A-C, the trench electrode 141 of the first type trench 14 (and, if present, the trench electrode of the dummy trench) may be electrically coupled to the control terminal 13 by means of the gate resistor 131, which may exhibit a resistance in the range of some Ohms, e.g., of less than 10 Ω. Further, the trench electrode 151 of the second trench type 15 may be electrically connected to the first load terminal 11.

In accordance with the embodiment of FIG. 5A, the trench electrode 161 of the at least one third type trench 16 is coupled to the control terminal 13 by means of a connection exhibiting an ohmic resistance of at least 1 Ω, or of at least 10 Ω, e.g., up to 20 Ω. To this end, a resistor 165 may be provided.

In accordance with the embodiment of FIG. 5B, the trench electrode 161 of the at least one third type trench 16 is coupled to the trench electrode 141 of the first type trench 14 by means of a connection exhibiting an ohmic resistance of at least 1 Ω, or of at least 10 Ω, e.g., up to 20 Ω. To this end, a resistor 164 may be provided.

In accordance with the embodiment of FIG. 5C, the trench electrode 161 of the at least one third type trench 16 is coupled to the first load terminal 11 by means of a connection exhibiting an ohmic resistance of at least 10 Ω, or of at least 100 Ω, e.g., up to 1000 Ω. To this end, a resistor 163 may be provided.

Instead of or in addition to providing the resistors 163, 164, 165, the comparatively high ohmic resistance of at least 10 Ω of the respective connection may also be established by an internal resistance of the trench electrode 161 of the third type trench 16. There are some approaches to achieve such comparatively high internal resistance, e.g., by providing one or more locally decreased cross-sections in the trench electrode 161, by reducing a dopant concentration in a poly-doped material of the trench electrode 161, by providing a small total contact area between the trench electrode 161 on the one side and the other terminal, e.g., terminal 13 or terminal 11, on the other side, to name a few possibilities, wherein these possibilities may also be combined with each other. Irrespective of the chosen approach (internal resistance and/or designated resistor 163, 164, 165), however, the effective ohmic resistance between the trench electrode 161 and the terminal it may be connected to shall amount to at least 10 Ω, in accordance with an embodiment.

For example, the effective ohmic resistance between the trench electrode 161 of the third type trench 16 and one of the first load terminal 11 and the control terminal 13 is greater than a total resistance between the trench electrode 141 of the first type trench 14 and the control terminal 13, e.g., formed substantially by said gate resistor 131, by a factor of at least two. This factor can be greater than 10, even greater than 100 or even greater than 1000.

For example, the trench electrode 141 of the first type trench 14 is electrically coupled to the control terminal 13 by means of the gate resistor 131 having a resistance of less than 10 Ω, of less than 5 Ω, or of even less than 2 Ω.

Further, still referring to FIGS. 5A-C, in the event that the trench electrode 161 of the third type trench is coupled to one of the first load terminal 11 and the control terminal 13, irrespective of the chosen approach, e.g., irrespectively of realizing said comparatively high ohmic resistance of at least 1 Ω internally and/or by means of providing one the resistors 163, 164, 165, said connection between the trench electrode 161 of the third type trench 16 and one of the first load terminal 11 and the control terminal 13 can include a diode 19, wherein the anode port 191 of the diode 19 is connected to one the one of the first load terminal 11 and the control terminal 13 and the cathode port 192 of the diode 19 is connected to the trench electrode 161 of the third type trench 16. For example, the diode 19 is a clamping diode, e.g., a Zener diode, e.g., having a breakdown voltage of at least 5 V. Thus, in an embodiment, the trench electrode 161 can be connected to the first load terminal 11 by the resistor 163 and a parallel diode 19. For example, the diode 19 may allow to short the resistance for a negative differential potential between the trench electrode 161 and the trench electrode 151, for example during turn-off, and/or to limit a positive differential potential during turn-on, wherein said the differential potential may be limited to, for example, 10 V, 50 V or even 30 V.

In the following, some exemplary configurations of power unit cells 1-1 of the power semiconductor device 1 shall be explained with respect to FIGS. 6A-E. For ease of explanation, in these Figures, the trench electrodes 141 are referred to as "G", the trench electrodes 151 are referred to as "S", and the trench electrodes 161 referred to as "F". As illustrated in FIGS. 6A-E the power semiconductor device may comprise an edge region 1-2 that at least partially surrounds the power unit cells 1-1 which may form the active region of the power semiconductor device 1, i.e., that region that conducts the load current between the terminals 11 and 12.

As further illustrated in FIGS. 6A-E, all trenches 14, 15 and 16 of all power unit cells 1-1 may exhibit a stripe configuration; accordingly, also the trench electrodes 141 (G-electrodes), the trench electrodes 151 (S-electrodes) and the trench electrodes 161 (F-electrodes) may exhibit a stripe configuration, for example, a stripe configuration that traverses the entire active region and extends into the edge region 1-2, as illustrated in FIGS. 6A-E.

For establishing a connection between the buried trench electrodes G, S and F from external of the semiconductor body 10, e.g., from a surface region above the semiconductor body 10, first contact plugs 149 may be provided for the G-electrodes (trench electrodes 141), second contact plugs 159 may be provided for the S-electrodes (trench electrodes 151), and third contact plugs 169 may be provided for the F-electrodes (trench electrodes 161), in accordance with an embodiment.

FIGS. 6A-E schematically and exemplarily illustrate different contacting schemes. For example, in accordance with FIG. 6A, the first load terminal 11 may be connected to the F-electrodes (trench electrodes 161) by employing the third contact plugs 169 only in the edge region 1-2, so as to realize a connection exhibiting said ohmic resistance of at least 10 Ω. In contrast, for the S-electrodes (trench electrodes 151), the second contact plugs 159 may also employed in the active region, so as to realize a low ohmic connection between the first load terminal 11 and the S-electrodes (trench electrodes 151). In addition, the electric conductivity of the F-electrodes (trench electrodes 161) may be significantly higher as compared to the electric conductivity of the S-electrodes (trench electrodes 151), in accordance with an embodiment.

For example, also in accordance with the embodiments of FIGS. 6B-E, the first load terminal 11 may be connected to the F-electrodes (trench electrodes 161) by employing the third contact plugs 169 only in the edge region 1-2, so as to realize a connection exhibiting said ohmic resistance of at least 10 Ω. In contrast, for the S-electrodes (trench electrodes 151), the second contact plugs 159 may also employed in the active region, so as to realize a low ohmic connection between the first load terminal 11 and the S-electrodes (trench electrodes 151). In addition, the electric conductivity of the F-electrodes (trench electrodes 161) may be significantly higher as compared to the electric conductivity of the S-electrodes (trench electrodes 151). These FIGS. 6B-E shall rather emphasize that, in accordance with an embodiment, not every power unit 1-1 cell has to be configured in the exact same manner, as far as the neighborhood relationship between the three trench types 14, 15, and 16 and the first and second mesa zones 17 and 18 is concerned. Rather, the alignment of these components 14, 15, 16, 17 and 18 along the first lateral direction X must not necessarily follow a periodic pattern, but the pattern may change along the first lateral direction X, in accordance with an embodiment.

Regarding all embodiments disclosed above, each of the trenches 14, 15 and 16 of the power unit cell 1-1 may exhibit equal spatial dimensions. Further, each of the trench electrodes 141, 151, 161 of all trenches 14, 15 and 16 of the power unit cell 1-1 exhibit equal spatial dimensions. In addition, each of the trenches 14, 15 and 16 of the power unit cell 1-1 can be arranged equidistantly along a first lateral direction X. These spatial features may apply to all power unit cells 1-1 that may be included in the power semiconductor device 1. Further, the electric conductivity of the trench electrodes 161 of the third type trenches 16 can be lower as compared to the electric conductivity of at least one of the trench electrodes 141 and the trench electrodes 151, e.g., by a factor of at least two.

The width of the first mesa zone 17 in the first lateral direction X may be in the range of 10 nm to 2000 nm.

The width of the second mesa zone 18 in the first lateral direction X may be in the range of 10 nm to 2000 nm.

The width of each of the first type trench 14, the second type trench 15 and the third type trench 16 may be in the range of 500 nm to 2000 nm.

In an embodiment, the width of the first mesa zone 17 in the first lateral direction X may be greater/smaller than the width of the second mesa zone 18 in the first lateral direction, e.g., by a factor of at least 1.5. This may allow for adjusting the magnitude and time scale of the change of the self-adjusting potential of the trench electrode 161, in accordance with an embodiment.

In another embodiment, the trench electrodes 161 of the third type trenches 16 extend further along the extension direction Z as compared to at least one of the trench electrodes 141 of the first type trenches 14 and the trench electrodes 151 of the second type trenches 15. This may allow for adjusting the magnitude and time scale of the change of the self-adjusting potential of the trench electrode 161, in accordance with an embodiment.

Further, the thickness of the insulator 162 of the third trench type 16 may be greater/smaller than at least one of the thickness of the insulator 142 of the first trench type 14 and the thickness of the insulator 152 of the second trench type 15, e.g., by a factor of at least 1.5. For example, the insulators 142, 152 and 162 may each be formed by growing an oxide in the trenches 14, 15 and 16. In another embodiment, the insulator 162 of the third trench type may differ from the at least one of the insulator 142 of the first trench type 14 and the insulator 152 of the second trench type 15 in material. For example, the insulator 142 comprises at least one of silicon oxide (SiO2), whereas the insulator 152 and/or the insulator 162 comprises at least one of silicon oxynitride (SiOxNy).

In a yet further embodiment, the trench electrodes 161 of the third type trenches 16 may be pre-charged and, after the pre-charge has been provided in the trench electrodes 161, the trench electrodes 161 may be entirely electrically insulated. For example, a method of providing pre-charge in a trench electrode is described in U.S. Pat. No. 9,105,679, the entire content of which is herewith incorporated herein.

In accordance with a further embodiment, a method of processing a power semiconductor device is disclosed. For example, the processing method is a method of producing a power semiconductor device 1 in accordance with one or more of the embodiments described above. The method may comprise forming a semiconductor body 10 to be coupled to a first load terminal 11 and a second load terminal 12 of the power semiconductor device 1 and that includes a drift region 100 configured to conduct a load current between said terminals 11 and 12, the drift region 100 comprising dopants of a first conductivity type. The method may further comprise forming a source region 101 to be arranged in electrical contact with the first load terminal 11 and comprising dopants of the first conductivity type; and forming a channel region 102 comprising dopants of a second conductivity type and isolating the source region 101 from the drift region 100. The method may further comprise creating at least one power unit cell 1-1 that includes at least one first type trench 14, at least one second type trench 15 and at least one third type trench 16, said trenches 14, 15 and 16 being arranged laterally adjacent to each other, wherein each of said trenches 14, 15 and 16 extends into the semiconductor body 10 along an extension direction Z and includes an insulator 142, 152, 162 that insulates a respective trench electrode 141, 151, 161 from the semiconductor body 10. The method may further comprise configuring the at least one power unit cell 1-1 such that it includes a first mesa zone 17 of the semiconductor body 10, the first mesa zone 17 being laterally confined at least by the at least one first type trench 14 and comprising at least a respective section of each of the source region 101, the channel region 102 and the drift region 100, wherein the trench electrode 141 of the at least one first type trench 14 is to be electrically coupled to a control terminal 13 of the power semiconductor device and configured to control the load current in the section of the channel region 102 that is included in the first mesa zone 17. The method may further comprise configuring the at least one power unit cell 1-1 such that it includes a second mesa zone 18 of the semiconductor body 10, the second mesa zone 18 being laterally confined at least by the at least one third type trench 16, and wherein, in a vertical cross-section of the power unit cell 1-1, the power unit cell 1-1 is configured to prevent the load current from crossing a transition 181 between the second mesa zone 18 and the first load terminal 11, and wherein the trench electrode 161 of the at least one third type trench 16 exhibits another electrical potential than each of the trench electrode 141 of the at least one first type trench 14 and the first load terminal 11.

The method of processing a power semiconductor device may be varied in accordance with the embodiments of the power semiconductor device 1 disclosed above. In so far, it is referred to the aforesaid. For example, the method may include pre-charging the trench electrodes 161 and entirely electrically insulating the trench electrodes 161 of the third type trenches 16. Further, the method may be carried out so as to reduce the electric conductivity in the trench electrodes 161 of the third type trenches 16 as compared to the electric conductivity of the trench electrodes 141 and 151. The method may further be carried out so as to achieve said differences in the thicknesses of the insulators 142, 152 and 162.

In the above, embodiments pertaining to semiconductor device processing methods were explained. For example, these semiconductor devices are based on silicon (Si). Accordingly, a monocrystalline semiconductor region or layer, e.g., the semiconductor body 10, the drift region 100, the collector region 108, the source region 101, the channel region 102 of exemplary embodiments, can be a monocrystalline Si-region or Si-layer. In other embodiments, polycrystalline or amorphous silicon may be employed.

It should, however, be understood that the semiconductor body 10 and components, e.g., regions 100, 108, 101 and 102 can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The aforementioned semiconductor materials are also referred to as "homojunction semiconductor materials". When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGalnN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide (SixC1-x) and silicon-SiGe heterojunction semiconductor materials. For power semiconductor devices applications currently mainly Si, SiC, GaAs and GaN materials are used.

Spatially relative terms such as "under", "below", "lower", "over", "upper" and the like, are used for ease of description to explain the positioning of one element relative to a second element. These terms are intended to encompass different orientations of the respective device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising", "exhibiting" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A power semiconductor device, comprising:
   a semiconductor body coupled to a first load terminal and a second load terminal and comprising a drift region configured to conduct a load current between the first load terminal and the second load terminal;
   a source region arranged in electrical contact with the first load terminal;
   a channel region isolating the source region from the drift region; and
   at least one power unit cell comprising:
      at least one first type trench, at least one second type trench, and at least one third type trench, each of the trenches extending into the semiconductor body and comprising an insulator that insulates a respective trench electrode from the semiconductor body;
      a first mesa zone of the semiconductor body, the first mesa zone being laterally confined at least by the at least one first type trench and by the at least one second type trench, the first mesa zone comprising at least a respective section of each of the source region, the channel region, and the drift region;
      a second mesa zone of the semiconductor body, wherein in a vertical cross-section of the power unit cell, the power unit cell is configured to prevent the load current from crossing a transition between the second mesa zone and the first load terminal;
      a further second mesa zone of the semiconductor body, wherein in a vertical cross-section of the power unit cell, the power unit cell is configured to prevent the load current from crossing a transition between the further second mesa zone and the first load terminal,
      wherein the at least one third type trench is located between the second mesa zone and the further second mesa zone,
      wherein the trench electrode of the at least one first type trench is electrically coupled to a control terminal of the power semiconductor device and configured to control the load current in the section of the channel region that is included in the first mesa zone,
      wherein the trench electrode of the at least one second type trench is electrically connected to the first load terminal,
      wherein the trench electrode of the at least one third type trench is configured to exhibit another electrical potential than each of the trench electrodes of the at least one first type trench and the at least one second type trench at least during a switching operation of the power semiconductor device, and
      wherein an effective ohmic resistance between the trench electrode of the third type trench and one of the first load terminal and the control terminal is greater than a total resistance between the trench electrode of the first type trench and the control terminal by a factor of at least two.

2. The power semiconductor device of claim 1, wherein the trench electrode of the at least one third type trench is electrically floating.

3. The power semiconductor device of claim 1, wherein the trench electrode of the at least one third type trench is coupled to the first load terminal by a connection exhibiting an ohmic resistance of at least 10 Ω.

4. The power semiconductor device of claim 3, wherein the ohmic resistance of at least 10 Ω is established by an internal resistance of the trench electrode of the third type trench.

5. The power semiconductor device of claim 1, wherein the trench electrode of the at least one third type trench is coupled to the control terminal by a connection exhibiting an ohmic resistance of at least 1 Ω.

6. The power semiconductor device of claim 5, wherein the ohmic resistance of at least 1 Ω is established by an internal resistance of the trench electrode of the third type trench.

7. The power semiconductor device of claim 1, wherein the trench electrode of the at least one third type trench is coupled to one of the first load terminal and the control terminal by a diode, wherein the anode port of the diode is connected to one of the first load terminal and the control terminal and the cathode port of the diode is connected to the trench electrode of the third type trench.

8. The power semiconductor device of claim 7, wherein the diode is a Zener diode.

9. The power semiconductor device of claim 1, wherein the trench electrode of the first type trench is electrically coupled to the control terminal by means of a gate resistor having a resistance of less than 10 Ω.

10. The power semiconductor device of claim 1, wherein the power semiconductor device is a switchable power semiconductor device, the trench electrode of the first type trench being configured to control a switching operation by receiving a control signal having a defined control voltage from a control signal generator, wherein the trench electrode of the third type trench is configured to exhibit an electrical potential that differs from the electrical potential of the trench electrode of the first type trench by at least 1 V for at least 10% of the duration of the switching operation.

11. The power semiconductor device of claim 1, wherein the electrical potential of the trench electrode of the third trench type is a self-adjusting electrical potential.

12. The power semiconductor device of claim 1, wherein the trench electrode of the third type trench exhibits the other electrical potential at least during a switching operation of the power semiconductor device in order to influence the switching operation of the power unit cell.

13. The power semiconductor device of claim 1, wherein the first mesa zone is further laterally confined by one of the at least one second type trench and a further first type trench.

14. The power semiconductor device of claim 1, wherein each of the trenches of the power unit cell exhibit equal spatial dimensions.

15. The power semiconductor device of claim 1, wherein each of the trench electrodes of the trenches of the power unit cell exhibit equal spatial dimensions.

16. The power semiconductor device of claim 1, wherein each of the trenches of the power unit cell are arranged equidistantly along a first lateral direction.

17. The power semiconductor device of claim 1, wherein the power semiconductor device exhibits an IGBT structure.

18. The power semiconductor device of claim 1, wherein the effective ohmic resistance between the trench electrode of the third type trench and one of the first load terminal and the control terminal is greater than a total resistance between the trench electrode of the first type trench and the control terminal by a factor of at least ten.

19. A method of processing a power semiconductor device, comprising:
    forming a semiconductor body to be coupled to a first load terminal and a second load terminal of the power semiconductor device and comprising a drift region configured to conduct a load current between the first load terminal and the second load terminal;
    forming a source region to be arranged in electrical contact with the first load terminal;
    forming a channel region isolating the source region from the drift region; and
    forming at least one power unit cell such that it includes:
        at least one first type trench, at least one second type trench, and at least one third type trench, each of the trenches extending into the semiconductor body and comprising an insulator that insulates a respective trench electrode from the semiconductor body;
        a first mesa zone of the semiconductor body, the first mesa zone being laterally confined at least by the at least one first type trench and by the at least one second type trench, the first mesa zone comprising at least a respective section of each of the source region, the channel region, and the drift region;
        a second mesa zone of the semiconductor body, wherein in a vertical cross-section of the power unit cell, the power unit cell is configured to prevent the load current from crossing a transition between the second mesa zone and the first load terminal;
        a further second mesa zone of the semiconductor body, wherein in a vertical cross-section of the power unit cell, the power unit cell is configured to prevent the load current from crossing a transition between the further second mesa zone and the first load terminal,
    wherein the at least one third type trench is located between the second mesa zone and the further second mesa zone,
    wherein the trench electrode of the at least one first type trench is to be electrically coupled to a control terminal of the power semiconductor device and configured to control the load current in the section of the channel region that is included in the first mesa zone,
    wherein the trench electrode of the at least one second type trench is electrically connected to the first load terminal,
    wherein the trench electrode of the at least one third type trench is configured to exhibit another electrical potential than each of the trench electrodes of the at least one first type trench and the at least one second type trench at least during a switching operation of the power semiconductor device, and
    wherein an effective ohmic resistance between the trench electrode of the third type trench and one of the first load terminal and the control terminal is greater than a total resistance between the trench electrode of the first type trench and the control terminal by a factor of at least two.

20. The method of claim 19, wherein forming the at least one power unit cell comprises forming the at least one power unit cell such that the effective ohmic resistance between the trench electrode of the third type trench and one of the first load terminal and the control terminal is greater than a total resistance between the trench electrode of the first type trench and the control terminal by a factor of at least ten.

* * * * *